United States Patent
Dev et al.

(10) Patent No.: US 8,719,651 B1
(45) Date of Patent: May 6, 2014

(54) SCAN CHAIN DIAGNOSTIC USING SCAN STITCHING

(75) Inventors: Nilabha Dev, Ghaziabad (IN); Sameer Chakravarthy Chillarige, Greater Noida (IN); Shaleen Bhabu, New Delhi (IN)

(73) Assignee: Cadence Design Systems, Inc., San Jose, CA (US)

( * ) Notice: Subject to any disclaimer, the term of this patent is extended or adjusted under 35 U.S.C. 154(b) by 206 days.

(21) Appl. No.: 13/330,466

(22) Filed: Dec. 19, 2011

(51) Int. Cl.
*G01R 31/28* (2006.01)
*G06F 11/00* (2006.01)

(52) U.S. Cl.
USPC ............ 714/741; 714/726; 716/105; 716/108

(58) Field of Classification Search
USPC ..................... 714/726, 741; 716/18, 105, 108
See application file for complete search history.

(56) References Cited

U.S. PATENT DOCUMENTS

| | | | |
|---|---|---|---|
| 2005/0028128 A1* | 2/2005 | Sachs | 716/18 |
| 2010/0169727 A1* | 7/2010 | Ito et al. | 714/726 |
| 2012/0030532 A1* | 2/2012 | Jain et al. | 714/726 |

* cited by examiner

*Primary Examiner* — Sam Rizk
(74) *Attorney, Agent, or Firm* — Kenyon & Kenyon LLP

(57) ABSTRACT

An apparatus and method for generating scan chain connections for an integrated circuit (IC) in order to perform scan diagnosis of a manufactured IC chip, in which the scan chain connections are determined using functional path information among the flip flops of the IC design corresponding to the IC chip. A plurality of flip flops included in the IC is grouped into at least a first group and a second group based on the functional path information among the flip flops. At least one scan chain is generated from at least a portion of the flip flops in the first group. At least one scan chain is generated from at least a portion of the flip flops in the second group.

22 Claims, 6 Drawing Sheets

SCAN CHAIN DIAGNOSTIC USING SCAN STITCHING

BACKGROUND

The present invention relates to the field of integrated circuit analysis. More particularly, the present invention relates to integrated circuit defect analysis.

Integrated circuit (IC) design is a laborious and complex process that involves iterations of design development and takes into account a large number of constraints (e.g., power requirements, processing requirements, etc.). To facilitate the design process, computer modeling of the IC is commonly performed to study various performance characteristics of the proposed design. Even with a perfect design, however, the manufactured IC corresponding to the design may be less than perfect. Deviations between the design and manufactured versions of the IC may arise due to one or more factors, such as, a defect in the manufacturing process, a defect in the manufacture of a particular IC, manufacturing limitation(s) unforeseen during the design process, or real world limitations (e.g., material characteristics).

Depending on the defect, it is possible that even a single defect in a manufactured IC may render the entire IC defective. With present ICs containing upwards of billions of devices (e.g., resisters, capacitors, inductors, transistors, diodes, flip flops, etc.) along with the necessary connections there between to operate in a desired manner, identifying the source(s) of the defect within the IC is no easy task. One way to enable testing of manufactured ICs (to determine IC defects) is to include design for test (DFT) structures in the IC during the design process.

An example of DFT structures included in an IC is scan chains. A scan chain comprises flip flops (or other sequential devices) serially connected to each other, the output of one flip flop being the input of the next flip flop in the series. One or more such scan chains can be included in an IC. For each manufactured IC, an IC tester loads a pre-determined test pattern to each scan chain of the manufactured IC and correspondingly reads out a unload pattern from each scan chain. This is referred to as a scan test. One or more pre-determined test patterns may be inputted to each scan chain for the scan test. An unload pattern from a particular scan chain that differs from an expected pattern indicates the presence of a defect within that scan chain.

For each scan chain in which it's unload pattern differs from the expected pattern, the next step is to determine the location of the failure. Scan chain diagnostic is used to identify the exact location in the failing scan chain. Performing scan chain diagnostics uses the fail data collected from the IC tester to narrow down the failure location. Ideally the scan chain diagnostics should pinpoint the exact flip flop(s) within a scan chain that is defective. In practice, however, diagnosis of the scan chain defect is less precise.

Typically, any of a number of flip flops in a scan chain may be diagnosed as being defective, rather than a specific flip flop in the scan chain. The inability to pinpoint a particular flip flop may occur due to insufficiency of the test data. Another cause may be due to the IC design itself—the design making it difficult to distinguish between two bit positions of the flip flops or certain bit positions in a scan chain that can not be diagnosed. Because scan chain diagnosis identifies the failing flip flop(s) based on those flip flop(s) with the highest failure probability (e.g., weighted binary determination), the locations of flip flops dictated by the IC design can limit the ability to pinpoint a particular flip flop.

Diagnosis of scan chain defects is also computationally intensive. It requires performing circuit simulations using numerous pre-determined test patterns, analyzing the corresponding unload patterns, and iteratively adjusting the circuit simulation in an attempt to match the (fail) test data from the manufactured IC to those observed in the circuit simulations. Since each manufactured IC is tested and it can contain more than one scan chain, in volume diagnostic mode, this can be a high computational load.

Thus, it would be beneficial to provide a scan chain diagnostic tool that overcomes the difficulty in locating defects due to the IC design itself. It would be further beneficial to provide a simulation tool that enhances the accuracy and performance throughput of scan chain diagnostics in the post-manufacturing stage of the IC design process.

BRIEF SUMMARY

An apparatus and method for synthesizing scan chains to perform scan chain diagnostics on a manufactured integrated circuit (IC) chip is disclosed herein. A plurality of flip flops included in an IC is allocated into at least a first group and a second group based on the functional driver-load relationship among the flip flops. One or more scan chains are synthesized from the flip flops allocated to the first group in accordance with a set of criteria. One or more scan chains also synthesized from the flip flops allocated to the second group in accordance with the set of criteria. Flip flops that cannot be allocated to either the first or second group are added to the scan chains synthesized for the first and second groups in accordance with the set of criteria. If there is any functional shift register included in the IC, each of such functional shift register is formed into scan chains of a certain length.

Other features and aspects of the invention will become apparent from the following detailed description, taken in conjunction with the accompanying drawings which illustrate, by way of example, the features in accordance with the embodiments.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

The headings provided herein are for convenience only and do not necessarily affect the scope or meaning of the terms used.

DETAILED DESCRIPTION

The following description is presented to enable any person skilled in the art to create and use a computer system configuration and related method and article of manufacture to generate scan chain connections of an IC to perform scan diagnosis of a manufactured IC chip. In some embodiments, the scan chain connections are determined using functional path information among the flip flops of the IC design corresponding to the IC chip. The scan chain connections are selected so as to place flip flops having a functional relationship with each other in separate scan chains. Moreover, the flip flops forming a functional shift register exceeding a certain bit length are allocated to at least two different scan chains to address the difficulty of identifying the exact flip flop within a long functional shift register that is faulty. The scan chain connections are modeled within a circuit simulation environment to analyze the outputs of the modeled system against the test output data from scan chains in the manufactured IC chip. The analysis results in identification of the exact flip flop (or narrowing down to within a few flip flops) that is faulty within a scan chain of the manufactured IC chip. Various modifications to the preferred embodiments will be readily apparent to those skilled in the art, and the generic principles defined herein may be applied to other embodiments and applications without departing from the spirit and scope of the invention. Moreover, in the following description, numerous details are set forth for the purpose of explanation. However, one of ordinary skill in the art will realize that the invention might be practiced without the use of these specific details. In other instances, well-known structures and processes are shown in block diagram form in order not to obscure the description of the invention with unnecessary detail. Thus, the present invention is not intended to be limited to the embodiments shown, but is to be accorded the widest scope consistent with the principles and features disclosed herein.

An IC comprises at least two types of structures—scan chain(s) and combinational logic. A scan chain comprises a design for test (DFT) structure included in the IC design (and which is included in the corresponding manufactured IC) for purposes of facilitating detection of IC hardware defect. A scan chain may comprise, for example, flip flops (or other sequential devices) serially connected to each other, the output of a proceeding flip flop being the input of the next flip flop in the series.

Figure 1:
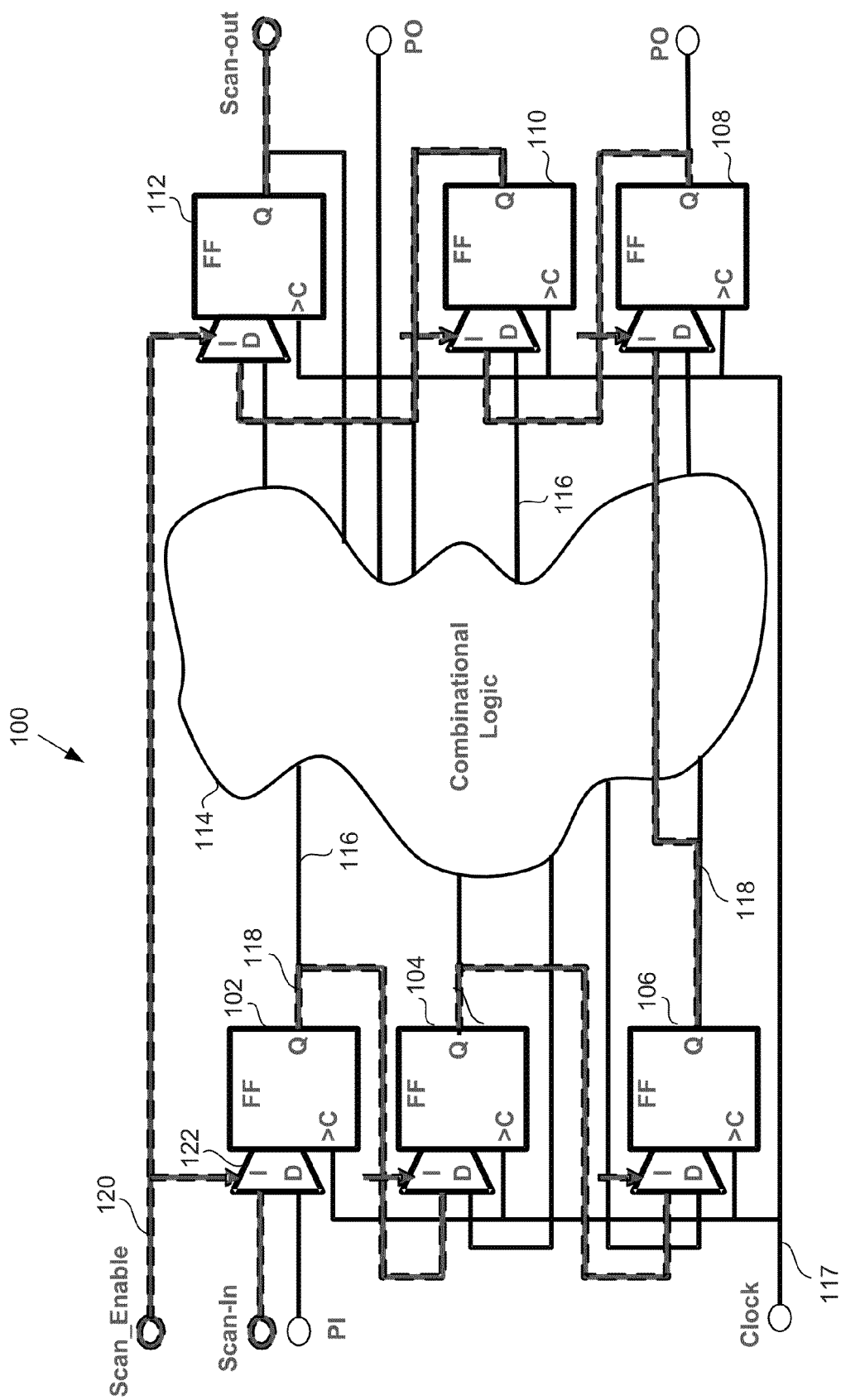
FIG. 1 illustrates an example portion of an integrated circuit (IC) according to some embodiments.

FIG. 1 illustrates an example portion of an IC 100 according to some embodiments. The IC 100 includes flip flops 102, 104, 106, 108, 110, 112 and combinational logic 114. In functional mode, the flip flops 102, 104, 106, 108, 110, 112 in combination with the combinational logic 114 comprise functional circuitry, shown in FIG. 1 as functional connections or pathways 116 (solid line). Combinational logic 114 may comprise, but is not limited to, resisters, transistors, diodes, capacitors, and the like. When in scan mode, the flip flops 102, 104, 106, 108, 110, 112 comprise the scan chain 118, shown in FIG. 1 as dotted lines. All of the flip flops 102, 104, 106, 108, 110, 112 are tied to a common clock line 117 for both functional and scan modes.

For each of the flip flops 102, 104, 106, 108, 110, 112, a multiplexer 122 is connected to its data input line. The multiplexer 122 is configured to permit its respective flip flop to operate in functional mode and in scan mode. The multiplexer 122, for example, can be a 2:1 multiplexer. As shown in FIG. 1, an input denoted as "D" in the multiplexer 122 is the data-in line for a given flip flop operating in functional mode. An input denoted as "I" in the multiplexer 122 is the data-in line for a given flip flop operating in scan mode.

The scan chain 118 comprises the flip flops 102, 104, 106, 108, 110, 112 daisy chained together in the following order: the output of flip flop 102 is the input to flip flop 104, the output of flip flop 104 is the input to flip flop 106, the output of flip flop 106 is the input to flip flop 108, the output of flip flop 108 is the input to flip flop 110, and the output of flip flop 110 is the input to flip flop 112. The input of flip flop 102 is referred to as a scan-in line and it is where the test pattern (generated by a test pattern generator) is applied. The output of flip flop 112 is referred to as a scan-out line and it is where the unload pattern (corresponding to the inputted test pattern) is read out. All of the flip flops in the scan chain 118 are tied to a scan-enable line (via the multiplexer 122). A scan-enable test control signal is applied to the scan-enable line to place flip flops 102, 104, 106, 108, 110, 112 in the scan mode or state.

Each of the flip flops 102, 104, 106, 108, 110, 112 represents a bit position. When a scan chain, such as the scan chain 118, is tested, the test pattern shifts one bit position per clock cycle. The clock is pulsed the same number of times as the (bit) length of the scan chain. At the completion of this operation, the inputted test pattern (also referred to as stimulus data) will have loaded in each and every flip flop of the scan chain.

One or more scan chains may be included in the IC 100. Each scan chain may also be the same or different length from each other (e.g., a scan chain may contain a different number of flip flops from another scan chain, the flip flops of a scan chain may be more dispersed in the IC than the flip flops of another scan chain, etc.). A flip flop included in the IC 100 can be part of one or more scan chains. A flip flop included in the IC 100 can also be part of one or more functional circuitry.

The IC 100 is packaged in a chip that includes pins. The pins serve as the input and output interfaces for the chip. Two pins are associated with each scan chain included in the IC 100—an input pin coupled to the scan-in line of a scan chain and an output pin coupled to the scan-out line of the scan chain. For this reason, the number of scan chains in an IC chip may be limited by the number of pins that may be provided for scan chains. During the scan test, to be discussed in detail below, a test pattern is inputted to the input pins of the scan chains and the outputs of the corresponding output pins of the scan chains provide the unload patterns.

Figure 2:
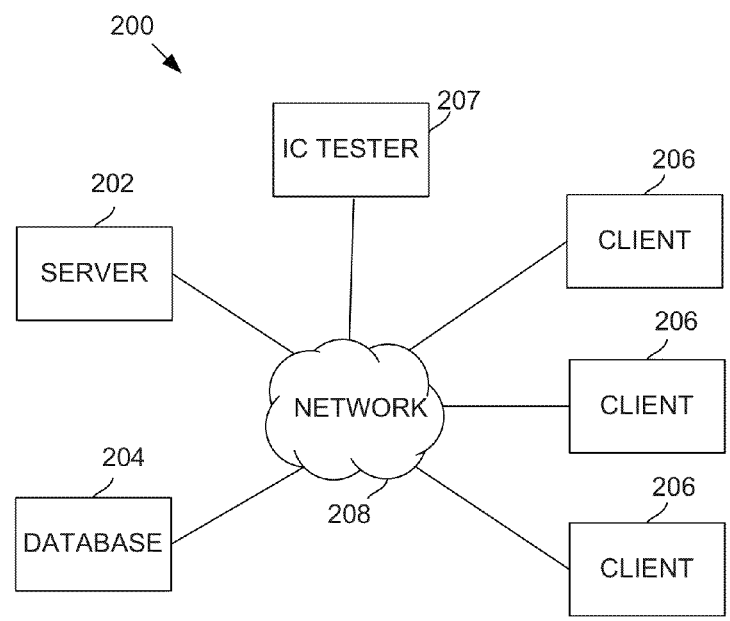
FIG. 2 illustrates an example system for providing scan test and scan diagnostic tools according to some embodiments.

FIG. 2 illustrates an example system 200 for providing scan test and scan diagnostic tools according to some embodiments. System 200 includes a server 202, a database 204, one or more clients 206, an IC tester 207, and a network 208. Each of server 202, database 204, clients 206, and IC tester 207 is in communication with network 208.

Server 202 comprises one or more computers or processors configured to communicate with clients 206 via network 208. Server 202 may be located at one or more geographically distributed locations. Server 202 hosts one or more applications accessed by clients 206 or IC tester 207, and/or facilitates access to the content of database 204. Database 204 comprises one or more databases configured to communicate with server 202, clients 206, and/or IC tester 207 via network 208. Although not shown, database 204 may also communicate with server 202 or IC tester 207 without needing network 208. Database 204 may be located at one or more geographically distributed locations from each other and also from server 202. Alternatively, database 204 may be included within server 202. Database 204 comprises a storage device for storing data and/or instructions for use by server 202, clients 206, and/or IC tester 207.

Each of clients 206 comprises a computer or other computing device, including but not limited to, work stations, personal computers, general purpose computers, Internet appliances, hand-held devices, wireless devices, portable devices, wearable computers, cellular or mobile phones, portable digital assistants (PDAs), smart phones, multi-processor systems, microprocessor-based or programmable consumer electronics, game consoles, set-top boxes, network PCs, mini-computers, and the like. Clients 206 include applications (e.g., web browser application such as Internet Explorer, Firefox, Safari, etc.) or other necessary interface capabilities to communicate with server 202, database 204, and/or IC tester 207 via network 208. Clients 206 may be located geographically dispersed from each other, server 202, IC tester 207, and/or database 204. Although three clients 206 are shown in FIG. 2, more or less than three clients may be included in system 200. IC testing personnel access the testing environment including access to the scan diagnostic tool via clients 206.

IC tester 207 comprises IC chip testing equipment configured to conduct scan tests on IC chips. The IC tester 207 includes pin connection locations to establish electrical contact with the pins of the IC chip being tested. The IC tester 207 also includes various components to conduct the scan tests such as, but not limited to, input source(s), output data capture devices, controller, and the like. In one embodiment, the IC tester 207 is configured to automatically input pre-determined test patterns to each IC chip being tested, to obtain the unload patterns corresponding to the inputted test patterns, and to save the obtained unload patterns in association with an unique identifier of the IC chip tested (e.g., save in the database 204). In another embodiment, the IC tester 207 is configured to receive scan testing instructions (e.g., test pattern(s) to apply to the IC chip being tested) from server 202 or clients 206, and to conduct the scan tests in response to the received instructions. The chips may be physically located at the IC tester 207, while the specification of the test inputs and processing of the test results occur elsewhere, such as at server 202 or clients 206. Although a single IC tester 207 is shown in FIG. 2, one or more IC testers may be included in system 200. For example, more than one IC tester may be used to simultaneously test a plurality of IC chips.

Alternatively, IC tester 207 may be a standalone station not connected to a network. In this case, database 204 (or similar functionality) may be included in the IC tester 207 to provide information to conduct the scan test. In yet another alternative, the scan test tool (or parts of the scan test tool) may be implemented on a peer-to-peer network rather than the server-client model shown in FIG. 2.

Network 208 comprises a communications network, such as a local area network (LAN), a wireless LAN (WLAN), a wide area network (WAN), a wireless WAN (WWAN), a metropolitan area network (MAN), an ad hoc network, an intranet, an extranet, a virtual private network (VPN), a portion of the Internet, the Internet, a portion of a public switched telephone network (PSTN), a cellular network, or a combination of two or more such networks. When network 208 comprises a public network, security features (e.g., VPN/SSL secure transport) may be included to ensure authorized access within system 200.

The testing environment capable of providing the scan diagnostic tool may be hosted by one or more components within system 200. In one embodiment, the scan diagnostic tool is hosted on server 202 and is remotely accessed by clients 206 via network 208. In another embodiment, the tool resides locally on clients 206. Server 202 may be involved for purposes of updating and/or monitoring the tool on clients 106, and/or to facilitate interaction with database 204 by clients 206. In still another embodiment, a portion of the tool may reside at server 202 and another portion of the tool may reside at clients 206.

Alternatively, clients 206 may be standalone stations not connected to a network. In this case, database 204 (or similar functionality) may be included in clients 206 to provide information used by the tool, as described in detail below. In yet another alternative, the tool may be implemented on a peer-to-peer network rather than the server-client model shown in FIG. 2.

In one embodiment, the scan diagnostic tool described herein is implemented as part of a larger simulator (a simulation product or service) that is capable of running different types of simulations and/or part of a larger chip tester (a testing product or service). For example, the simulator may be configured to perform the circuit simulations involved in scan diagnosis as described below. In another embodiment, the scan diagnosis may be implemented as a tool separate from the simulator and physical chip tester. In this case, the tool includes code to model the circuit (or is otherwise able to obtain the modeling information from another source such as the simulator), IC design specifications, scan test results (the unload patterns and associated scan chain data), and/or other information necessary to perform scan diagnosis.

Figure 3:
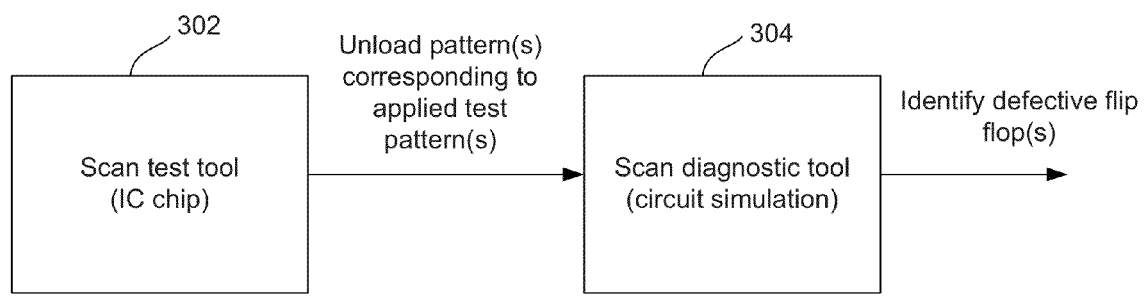
FIG. 3 illustrates an example block diagram showing the interaction between the scan testing and scan diagnostic tools according to some embodiments.

FIG. 3 illustrates an example block diagram showing the interaction between the scan testing and scan diagnostic tools according to some embodiments. A scan test tool 302 is configured to conduct a scan test on a manufactured IC chip as described in detail below. The scan test tool 302 (also referred to as a scan chain test tool or scan integrity test tool) applies one or more load patterns (also referred to as test patterns) to each scan chain of the manufactured IC chip. The scan test tool 302 also obtains an unload pattern (also referred to as a result or resultant pattern) for each applied load pattern from the manufactured IC chip. Next, a scan diagnostic tool 304 performs scan stitching (also referred to as chain stitching) and then circuit simulation(s) based on the scan stitching, as described in detail below. The scan diagnostic tool 304 is configured to identify defective or failing flip flops(s) in each scan chain identified by the scan test tool 302 as being defective. In one embodiment, a defective flip flop may be exactly identified. In another embodiment, a defective flip flop may be identified to within a few flip flop positions in the IC chip.

Figure 4:
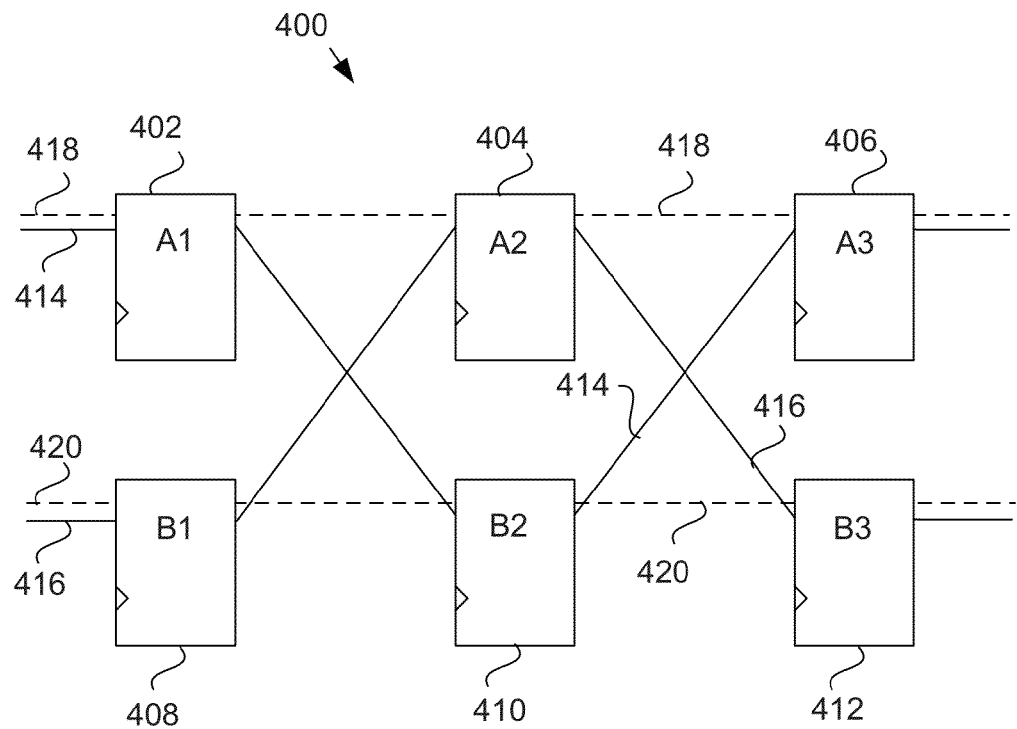
FIG. 4 illustrates an example plurality of flip flops included in an IC chip according to some embodiments.

FIG. 4 illustrates an example plurality of flip flops 400 included in an IC chip according to some embodiments. The flip flops 400 and surrounding circuitry are shown simplified for ease of illustration. For example, the multiplexer for each flip flop has been omitted for ease of illustration. The plurality of flip flops 400 comprises (portions of) scan chains and functional logic or circuitry. In particular, a first functional logic/circuitry 418 includes flip flops 402, 404, and 406. A second functional logic/circuitry 420 includes flip flops 408, 410, 412. First and second functional logic/circuitry 418, 420 also includes combinational logic, which is not shown for ease of illustration. Although not shown, one or more devices (e.g., resisters, capacitors, diodes, transistors, etc.) can be included between flip flops 402 and 404, flip flops 404 and 406, flip flops 408 and 410, and/or flip flops 410 and 412. A first scan chain 414 includes flip flops 402, 410, and 406. A second scan chain 416 includes flip flips 408, 404, and 412.

It is understood that although flip flops 402, 404, 406, 408, 410, 412 are shown next to each other, one or more of these flip flops may be distally located from each other. For example, flip flop 402 may be physically located within a top left quadrant of the IC chip, flip flop 410 may be physically located within a top right quadrant of the IC chip, and flip flop 406 may be physically located within a bottom right quadrant of the IC chip. It is also understood that the IC chip may include more flip flops than shown in FIG. 4. For example, an IC chip can include tens of thousands of flip flops, more or less than two scan chains, and/or more or less than two functional logic/circuitry pathways.

Figure 5:
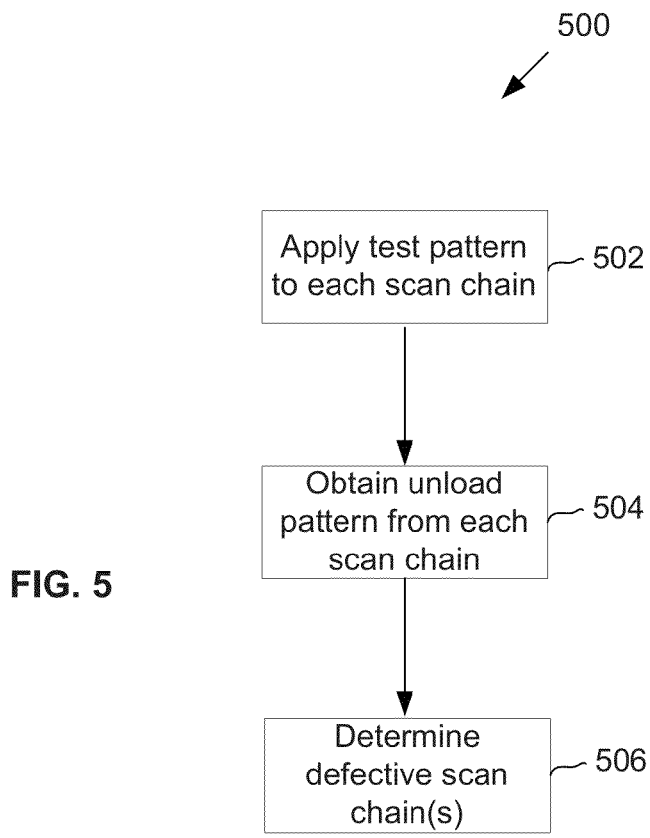
FIG. 5 illustrates an example flow diagram providing implementation details of the scan test tool according to some embodiments.
Figure 6:
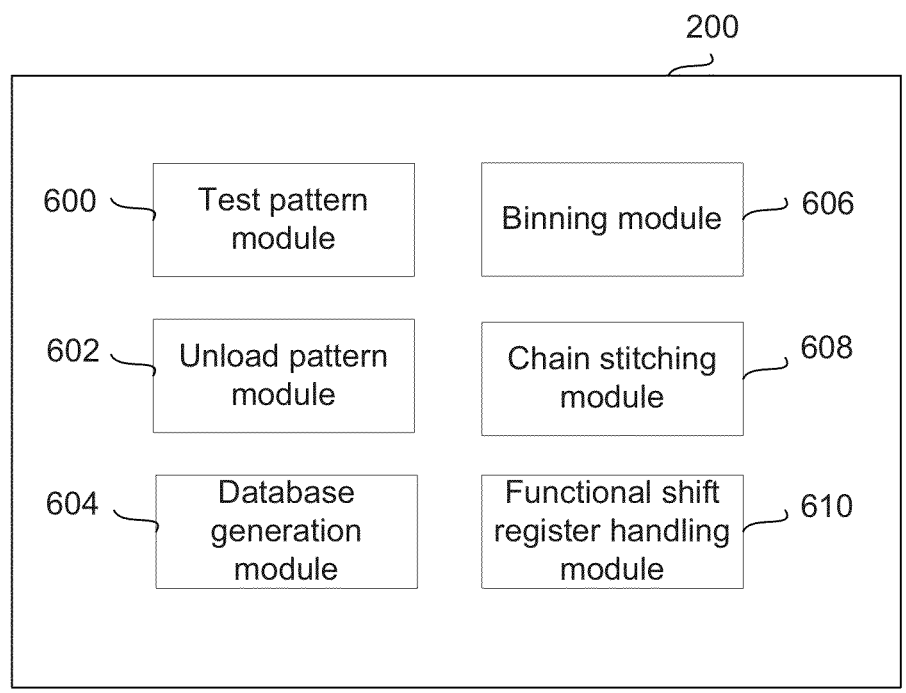
FIG. 6 illustrates example modules included in the system of FIG. 2 configured to carry out or control the scan test tool and for generating scan chains for the scan diagnostic tool according to some embodiments.

The output of the scan test tool 302 may be considered to be pre-curser data to facilitate the scan diagnostic tool 304. FIG. 5 illustrates an example flow diagram 500 providing implementation details of the scan test tool 302 according to some embodiments. The flow diagram 500 includes a apply test pattern block 502, an obtain unload pattern block 504, and a determine defective scan chain(s) block 506. FIG. 6 illustrates example modules included in the system 200 configured to carry out or control the scan test tool 302 and for generating scan chains for the scan diagnostic tool 304 according to some embodiments. The modules comprise a test pattern module 600, an unload pattern module 602, a database generation module 604, a binning module 606, a chain stitching module 608, and a functional shift register handling module 610. The modules comprise computer or machine executable instructions executed by one or more processors provided in the system 200 (e.g., server 202, clients 206, IC tester 207) to cause the processes shown in the flow diagram 500 and in flow diagram 700 (see FIG. 7) to be carried out. It is understood that more or fewer modules than shown in FIG. 6 may carry out the flow diagram 500. FIG. 5 will be discussed below in conjunction with FIG. 6.

At a block 502, the test pattern module 600 is configured to apply a test pattern to every scan chain of a manufactured IC chip (also referred to as a produced or fabricated IC chip). The scan chains may be, for example, the first and second scan chains 414, 416 shown in FIG. 4. In one example, the test pattern applied (also referred to as inputted or loaded) to each scan chain can be the following test pattern: 001100110011.

In response, at the block 504, the unload pattern module 602 is configured to obtain an unload pattern corresponding to the applied test pattern from each of the scan chains. The unload pattern module 602 saves the unload patterns with appropriate identifier information, such as, the IC chip identification number, scan chain identifier (e.g., chip pin number), the loaded test patter, and the like for later use. The unload patterns may be stored in the database 204.

Next as the block 506, each of the unload patterns is analyzed to determine if one or more of the scan chains of that manufactured IC chip is failing (e.g., by the unload pattern module 602). If the unload pattern of a given scan chain matches the test pattern, that scan chain is deemed to be defect-free. Otherwise, the non-matching unload pattern indicates that the scan chain contains at least one defective flip flop. Moreover, the values of the unload pattern provide clues as to the nature of the defect. For example, the following table provides information about the particular nature of the defect with respect to the particular unload pattern outputted from the scan chain for test pattern 001100110011. Information about the scan chain(s) identified to be defective can be stored in the database for later use.

| Unload | Result | Comment |
| --- | --- | --- |
| 111111111111 | Stuck at 1 | None |
| 000000000000 | Stuck at 0 | None |
| 000100010001 | Fast fall | Last 1 in each set becomes 0 |
| 001000100010 | Slow rise | First 1 in each set becomes 0 |
| 101110111011 | Fast rise | Last 0 in each set becomes 1 |
| 011101110111 | Slow fall | First 0 in each set becomes 1 |
| x00110011001 | A/B clock stuck on 1 | Stuck for one latch |
| xx0011001100 | A/B clock stuck on 2 | Stuck for two latches |
| xxx001100110 | A/B clock stuck on 3 | Stuck for three latches |
| xxxx00110011 | A/B clock stuck on 4 | Stuck for four latches |

Figure 7:
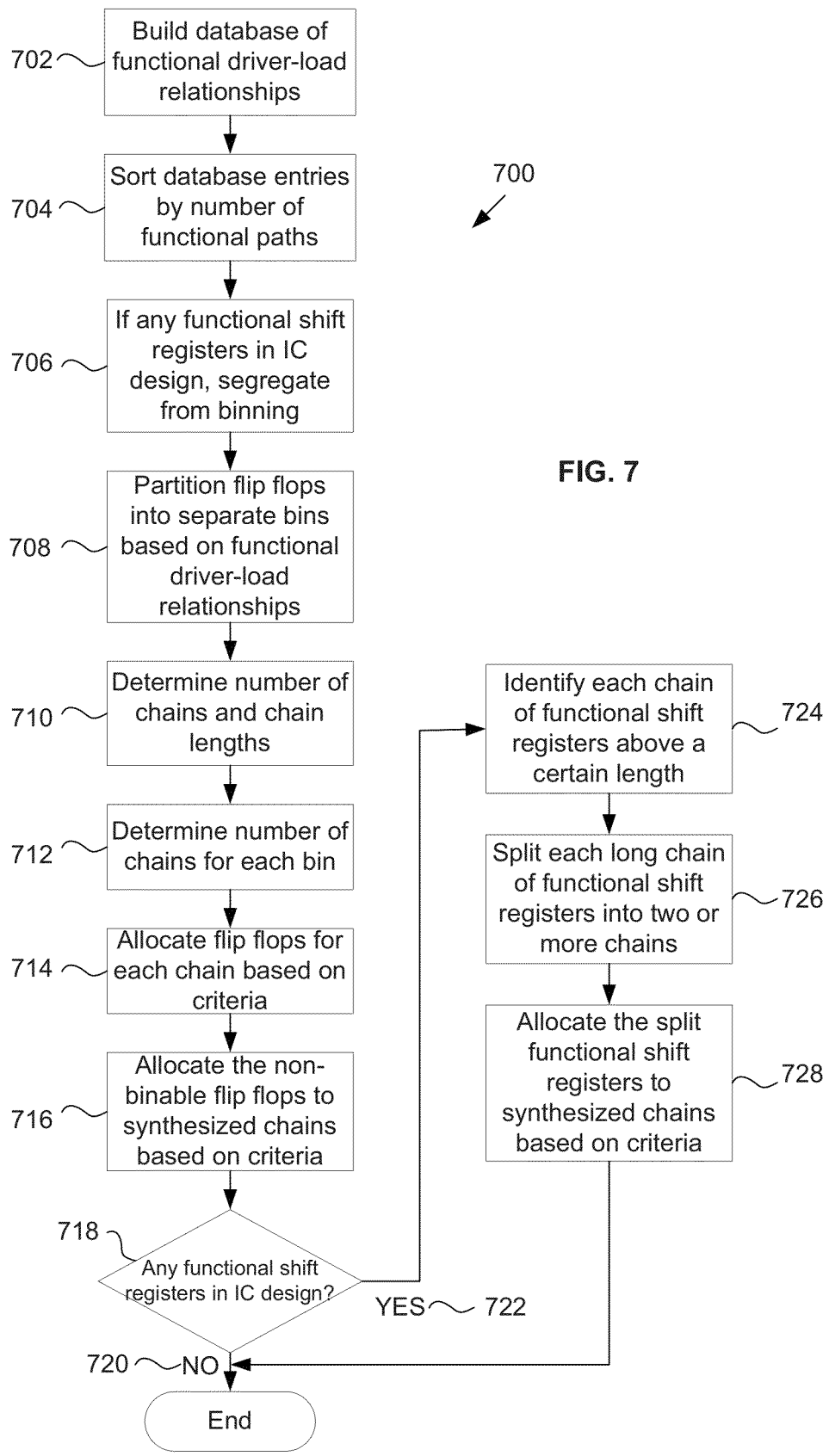
FIG. 7 illustrates an example flow diagram for synthesizing scan chain connections using functional path information for the scan diagnostic tool according to some embodiments.

As discussed above, the values of the unload pattern (relative to the known test pattern) provides information about the nature of the defect(s) in a particular scan chain. To identify the exact failing bit position (or to narrow down to within a few bit positions) in the particular scan chain, the scan diagnostic tool 304 uses functional path information pertaining to the flip flops. FIG. 7 illustrates an example flow diagram 700 for synthesizing scan chain connections (also referred to as scan chain stitching, scan chain connecting, chain stitching, or chain connecting) using functional path information for the scan diagnostic tool 304 according to some embodiments. The synthesis of the scan chain connections generates scan chains that are modeled in circuit simulations. Load patterns can then be applied to these simulated scan chains and unload patterns correspondingly obtained. Such simulated test data are analyzed against the test data obtained from the physical IC chip undergoing testing to pinpoint the actual location(s) of the failing flip flop(s) in the physical IC chip. FIG. 7 will be discussed below in conjunction with FIG. 6.

At a block 702, the database generation module 604 is configured to build a database, table, or other compilation of information representative of the functional connection driver-load relationship among all the flip flops in the IC chip. Each functional driver-load relationship identifies a first flip flop and a second flip flop, in which the first flip flop is the flip flop that precedes the second flip flop in a functional logic/circuitry path. Combinational logic may be disposed between the first and second flip flops in the functional logic/circuitry path. Such functional connection information can be obtained from the IC design schematics corresponding to the manufactured IC chip. (The functional circuitry may be identified within the IC design schematics by building up a chain of functional driver-load relationships.) The IC design schematics (also referred to as a circuit design or IC design) may be stored in the database 204. The functional driver-load relationship data may also be stored in the database 204. As an example, for the plurality of flip flops 400 in FIG. 4, the functional driver-load relationships are as follows:

A1->A2
A2->A3
B1->B2
B2->B3

Next at a block 704, the database generation module 604 is configured to sort the functional driver-load relationship data by increasing order of the number of functional relationships emanating from a given flip flop. For example, if in FIG. 4 flip flop 402 (A1) was also functionally connected to flip flop 412 (B3), then the sorted database entries would be as follows:

A2->A3
B1->B2
B2->B3
A1->A2, B3

As another example, if a first flip flop is connected to 100 other flip flops, a second flip flop is connected to 50 other flip flops, and a third flip flop is connected to one other flip flop, then they would be sorted as: third flip flop, second flip flop, and first flip flop.

Alternatively, the database entries may be sorted in decreasing order of the number of functional relationships. In any case, the database entries are ordered or notated in such a way that those flip flops with more functional connections are readily identified.

Before proceeding to allocate the flip flops of the IC chip into bins (also referred to as binning), if there are any functional shift registers (e.g., where the output of a preceding flip flop is the input to the next flip flop in a functional logic/circuitry path), those flip flops are segregated or excluded for separate treatment to be discussed below (block 706).

In one embodiment, at least two bins—a bin 1 and a bin 2—are used as conceptual containers to partition all of the flip flops of the IC chip excluding the flip flops that are functional shift registers, as discussed above (block 708). In particular, the partitioning or designation of each flip flop as belonging to a particular bin is based on their functional driver-load relationships, which is provided by the sorted database (see block 704). For a given pair of flip flops having a functional driver-load relationship, those two flip flops are placed into different bins from each other. For example, if flip flop 402 (A1) is placed in bin 1, then flip flop 404 (A2) is placed in bin 2. Conversely, if flip flop 402 (A1) is placed in bin 2, then flip flop 404 (A2) is placed in bin 1. All of the flip flops (excluding those that are functional shift registers) are similarly allocated into bins by the binning module 606.

However, there may be one or more flip flops that cannot be allocated to bins without violating the above separate bin rule. These flip flops are considered to be non-binable flip flops that may be later addressed as discussed below. For example, if flip flops F1->F2, F4 and F3->F4, F1, then flip flop F3 cannot be placed in either bin 1 or bin 2 under the separate bin rule.

In another embodiment, the flip flops may be partitioned using more than two bins. The same separate bin rule is applicable. The maximum number of bins is heuristic. Generally, the greater the number of bins, the greater the runtime of the circuit simulations pertaining to scan diagnosis.

Once the flip flops have been partitioned into bins, the chain stitching module 608 is configured to determine the number of scan chains and the length(s) of scan chains required for the particular IC design (block 710). In one embodiment, the maximum number of scan chains and/or the maximum scan chain length may be specified by a user of the system 200 (as per user constraints). As an example, the user may specify a maximum of 10 scan chains or a maximum scan chain length of 128 bits for the particular IC design. The user may be limited in the number of scan chains by the number of input/output pins of the IC design. The user may limit the scan chain length to keep the simulation time reasonable. In another embodiment, the chain stitching module 608 may be configured to determine a desirable number of scan chains and scan chain length. At a minimum, at least two scan chains are used.

Next, at a block 712, the chain stitching module 608 is configured to determine the number of scan chains for each bin in keeping with the maximum number of scan chains for the IC design (from block 710). In one embodiment, the length of each scan chain may be selected to be the same or of a similar length to each other, because the length of the longest chain is determinative of the simulation time. For example, if bin 1 contains 30 flip flops, bin 2 contains 70 flip flops and the maximum number of scan chains is 10, then the chain stitching module 608 may determine three scan chains for bin 1 and seven scan chains for bin 2.

For each of the scan chains determined in the block 712, the chain stitching module 608 allocates the flip flops that will compose those scan chains (block 714). In one embodiment, the selection of the particular flip flops within the appropriate bin and their connections to each other to specify a scan chain is determined based on (a set of) criteria such as, but not limited to, physical proximity, clock domain crossing minimization, power domain crossing minimization, and library domain crossing minimization. Physical proximity, for example, comprises information from the IC design schematic about the physical location of each flip flop in the IC chip. In order to minimize the wire length between flip flops, flip flops physically located near each others are selected to form a scan chain rather than using a distally located flip flop. As an example, flip flops within the same Cartesian coordinate quadrant may be selected for the same scan chain, rather than have flip flops from different quadrants form a scan chain. Clock domain crossing minimization comprises minimizing a signal (associated with a scan chain to be synthesized) crossing from one clock domain to another clock domain. Power domain crossing minimization comprises minimizing a signal (associated with a scan chain to be synthesized) crossing from one power domain to another power domain. Library domain crossing minimization comprises minimizing a signal (associated with a scan chain to be synthesized) crossing from one library domain to another library domain. This generation or creation of scan chains is also referred to as scan chain synthesis or scan chain stitching.

For the non-binable flip flops, the chain stitching module 608 is configured to add these flip flops to the scan chains synthesized above (block 716). The determination of which flip flop to add to which synthesized scan chain is made in accordance with the same criteria discussed above for allocating flip flops that have been grouped into bins (see block 714).

If there are no functional shift registers in the IC design (block 718 and no branch 720), then scan chain synthesis for scan diagnosis is complete. Otherwise (yes branch 722), the functional shift register handling module 610 is configured to identify any functional shift register within the IC design that is longer than a specific bit length (block 724). In one embodiment, the specific bit length may be the user specified maximum length. In another embodiment, the specific bit length may be a predetermined bit length. As an example, the specific bit length may be 10. When there is a scan chain fault within a shift register, it is difficult to pinpoint the failing flip flop. Traditional scan diagnosis may only be able to report that there is at least one failing flip flop within the shift register but not which one or portion of the shift register is failing. Diagnostic resolution (e.g., narrowing down of the faulty flip flop) is automatically improved by separating flip flops forming a functional shift register into separate scan chains.

For each functional shift register identified as exceeding the specific bit length, the functional shift register is split into at least two scan chains by the functional shift register handling module 610 (block 726). In one embodiment, each functional shift register exceeding the specific bit length may be split into scan chains of a fixed bit length, such as, two, three, or four bits, depending on the scan chain diagnostic resolution desired. In another embodiment, each functional shift register exceeding the specific bit length may be split into whatever number of scan chains are needed for each of those scan chains to be about an average shift register length, be less than the maximum scan chain length after being added to synthesized scan chains, or the like. In still another embodiment, one functional shift register exceeding the specific bit length within the IC design can receive a different splitting treatment than another functional shift register exceeding the specific bit length within the same IC design. For example, one functional shift register may be split into two scan chains, while another functional shift register may be split into three scan chains.

Lastly, the chain stitching module 608 is configured to allocate all the functional shift registers in the IC design—the functional shift registers that are under the specific bit length (e.g., the short functional shift registers) and also those that exceed the specific bit length (e.g., the split functional shift registers)—to the synthesized scan chains (block 728). The determination of which short or split functional shift register is added to which synthesized scan chain is made in accordance with the same criteria discussed above for allocating flip flops in the bins (see block 714). Thus, for example, if a 20 bit functional shift register is broken up into two parts and allocated to two different scan chains, then if one of these scan flip flop is found to be faulty, the resolution of identifying failure from the 20 bit functional shift register has been reduced in half.

Accordingly, all flip flops included in the IC design, which correspond to the manufactured IC chip being tested, have been allocated into scan chains specifically formulated to break apart flip flops having certain functional relationship with each other. These synthesized scan chains are modeled by a circuit simulator to apply test patterns and obtain unload patterns (similar to the scan test performed on the manufactured IC chip). These unload patterns are analyzed against the failure test data obtained from the manufactured IC chip. Due to the specific scan chain connections formulated, the bounds within which the defect is present in the IC chip may be readily identified. For example, if a scan test value is laterally inserted from a good chain to a faulty chain—the value loaded in one chain is captured in another chain—and this value is unloaded incorrectly at the IC tester 207, it is likely that the unloaded value is unloaded through a defective bit. On the other hand, if the unloaded value is correctly unloaded from the faulty chain, then it is likely that this value is not unloaded through a defective bit.

In this manner, scan diagnosis accuracy is improved by better pinpointing of the exact flip flop(s) that is defective in the IC chip. For example, if with traditional scan diagnostic methods the diagnosis is that a faulty flip flop exists in any flip flop in the second half of a 10-bit chain, then scan diagnosis using scan chain connections formulated based on functional relationships can yield identification of the exact faulty flip flop in the 10-bit chain or a narrower bound diagnosis, such as, flip flops 5 to 7 is faulty. Moreover, by controlling various scan chain characteristics (e.g., bit length of all the constructed scan chains), scan diagnostics runtimes are predictable and yield ramp is improved.

Figure 8:
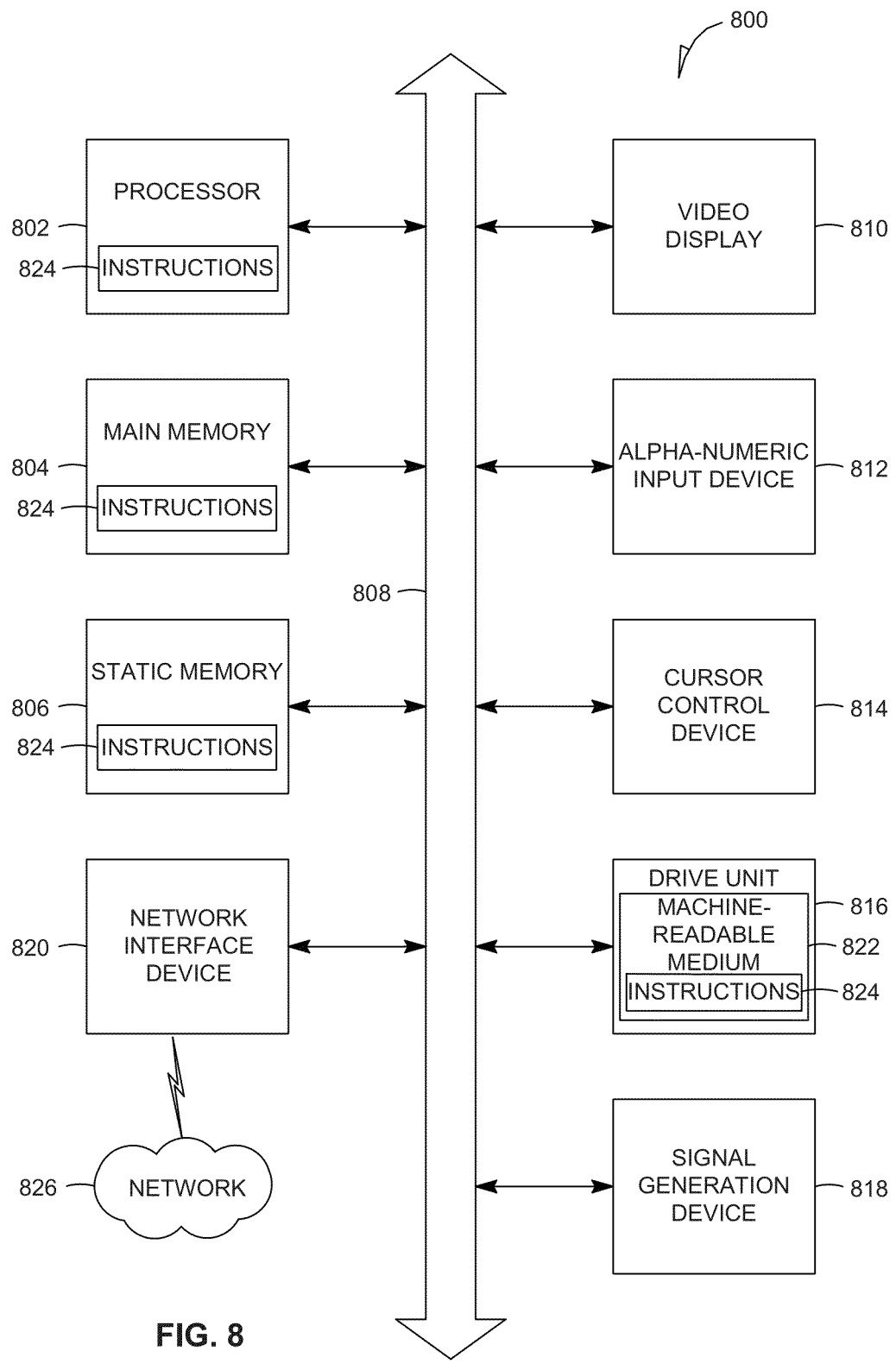
FIG. 8 illustrates a diagrammatic representation of a machine within which a set of instructions, for causing the machine to perform any one or more of the methodologies discussed herein, may be executed according to some embodiments.

FIG. 8 shows a diagrammatic representation of a machine in the example form of a computer system 800 within which a set of instructions, for causing the machine to perform any one or more of the methodologies discussed herein, may be executed. In alternative embodiments, the machine operates as a standalone device or may be connected (e.g., networked) to other machines. In a networked deployment, the machine may operate in the capacity of a server or a client machine in server-client network environment, or as a peer machine in a peer-to-peer (or distributed) network environment. The machine may be a server computer, a client computer, a personal computer (PC), a tablet PC, a set-top box (STB), a Personal Digital Assistant (PDA), a cellular telephone, a web appliance, a network router, switch or bridge, or any machine capable of executing a set of instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein.

The example computer system 800 includes a processor 802 (e.g., a central processing unit (CPU), a graphics processing unit (GPU), or both), a main memory 804 and a static memory 806, which communicate with each other via a bus 808. The computer system 800 may further include a video display unit 810 (e.g., liquid crystal display (LCD) or a cathode ray tube (CRT)). The computer system 800 also includes an alphanumeric input device 812 (e.g., a keyboard), a cursor control device 814 (e.g., a mouse), a disk drive unit 816, a signal generation device 818 (e.g., a speaker) and a network interface device 820.

The disk drive unit 816 includes a machine-readable medium 822 on which is stored one or more sets of instructions (e.g., software 824) embodying any one or more of the methodologies or functions described herein. The software 824 may also reside, completely or at least partially, within the main memory 804 and/or within the processor 802 during execution thereof by the computer system 800, the main memory 804 and the processor 802 also constituting machine-readable media.

The software 824 may further be transmitted or received over a network 826 via the network interface device 820.

While the machine-readable medium 822 is shown in an example embodiment to be a single medium, the term "machine-readable medium," "computer readable medium," and the like should be taken to include a single medium or multiple media (e.g., a centralized or distributed database, and/or associated caches and servers) that store the one or more sets of instructions. The term "machine-readable medium" shall also be taken to include any medium that is capable of storing, encoding or carrying a set of instructions for execution by the machine and that cause the machine to perform any one or more of the methodologies of the present invention. The term "machine-readable medium" shall accordingly be taken to include, but not be limited to, solid-state memories, optical and magnetic media, and carrier wave signals.

It will be appreciated that, for clarity purposes, the above description describes some embodiments with reference to different functional units or processors. However, it will be apparent that any suitable distribution of functionality between different functional units, processors or domains may be used without detracting from the invention. For example, functionality illustrated to be performed by separate processors or controllers may be performed by the same processor or controller. Hence, references to specific functional units are only to be seen as references to suitable means for providing the described functionality, rather than indicative of a strict logical or physical structure or organization.

Although the present invention has been described in connection with some embodiments, it is not intended to be limited to the specific form set forth herein. One skilled in the art would recognize that various features of the described embodiments may be combined in accordance with the invention. Moreover, it will be appreciated that various modifications and alterations may be made by those skilled in the art without departing from the spirit and scope of the invention. For example, one or more blocks of flow diagram 700 may be implemented in a different order or simultaneous with each other. Blocks 724, 726 may be performed simultaneously with formulation of scan chains comprising the flip flops placed into bin groups.

What is claimed is:

1. A method for synthesizing scan chains to perform scan chain diagnosis of an integrated circuit (IC) chip, the method comprising:
    determining, using a processor, a plurality of flip flops of the IC chip into at least a first group and a second group based on functional driver-load relationship among the flip flops;
    generating a first scan chain comprising at least a portion of the flip flops in the first group; and
    generating a second scan chain comprising at least a portion of the flip flops in the second group.

2. The method of claim 1, further comprising generating a table of functional connections among the flip flops using the functional driver-load relationship from an IC design schematic corresponding to the IC chip.

3. The method of claim 2, further comprising sorting the table of functional connections by a number of functional connections for each flip flop of the plurality of flip flops.

4. The method of claim 1, wherein the determining of the flip flops into the first group and the second group comprises for a pair of flip flops having the functional driver-load relationship with each other, allocating a first flip flop of the pair of flip flops to the first group and allocating a second flip flop of the pair of flip flops to the second group.

5. The method of claim 1, wherein the generating of the first scan chain comprises forming the first scan chain including a flip flop that is not in the first group and not in the second group, the flip flop being included in the IC chip.

6. The method of claim 1, further comprising:
    identifying a functional shift register in the IC chip that exceeds a predetermined bit length; and
    splitting the identified functional shift register that exceeds the predetermined bit length to add to each of the first scan chain and the second scan chain.

7. The method of claim 1, wherein the generating of the first scan chain comprises selecting the flip flops in the first group and connecting the selected flip flops based on a set of criteria.

8. The method of claim 7, wherein the set of criteria comprises physical proximity, clock domain crossing minimization, power domain crossing minimization, and library domain crossing minimization.

9. The method of claim 1, wherein the first scan chain conforms to a specified maximum scan chain length.

10. The method of claim 1, further comprising generating a third scan chain comprising another portion of the flip flops in the first group.

11. A system, comprising:
    a storage device encoded with information representative of an integrated circuit (IC) design; and
    a computing device in communication with the storage device, the computing device configured to:
    allocate a plurality of flip flops in the IC design into at least a first group and a second group based on functional driver-load relationship among the flip flops,
    determine a first scan chain comprising at least a portion of the flip flops in the first group, and
    determine a second scan chain comprising at least a portion of the flip flops in the second group.

12. The system of claim 11, wherein the computing device is configured to generate functional connection information associated with the flip flops using the information representative of the IC design, and wherein the storage device stores the generated functional connection information.

13. The system of claim 11, wherein the computing device is configured to allocate a pair of flip flops having the functional driver-load relationship with each other by allocating a first flip flop of the pair of flip flops to the first group and allocating a second flip flop of the pair of flip flops to the second group.

14. The system of claim 11, wherein the computing device is configured to determine the first scan chain having a flip flop that is not in the first group and not in the second group, the flip flop being included in the IC design.

15. The system of claim 11, wherein the computing device is configured to:
    identify a functional shift register in the IC design that exceeds a predetermined bit length; and
    split the identified functional shift register that exceeds the predetermined bit length to add to each of the first scan chain and the second scan chain.

16. The system of claim 11, wherein the computing device is configured to select the flip flops in the first group and connect the selected flip flops based on a set of criteria to generate the first scan chain.

17. The system of claim 16, wherein the set of criteria comprises physical proximity, clock domain crossing minimization, power domain crossing minimization, and library domain crossing minimization.

18. A non-transitory computer readable medium including instructions, when executed by a processor, causes the processor to perform operations comprising:
    allocating a plurality of flip flops in an integrated circuit (IC) design into at least a first group and a second group based on functional driver-load relationship among the flip flops, the IC design corresponding to an IC chip being tested for flip flop defects;
    determining a first scan chain comprising at least a portion of the flip flops in the first group; and
    determining a second scan chain comprising at least a portion of the flip flops in the second group.

19. The non-transitory computer readable medium of claim 18, wherein the allocating of the flip flops comprises for a pair of flip flops having the functional driver-load relationship with each other, allocating a first flip flop of the pair of flip flops to the first group and allocating a second flip flop of the pair of flip flops to the second group.

20. The non-transitory computer readable medium of claim 18, including further instructions to cause the processor to perform operations comprising:
    identifying a functional shift register in the IC design that exceeds a predetermined bit length; and
    splitting the identified functional shift register that exceeds the predetermined bit length to add to each of the first scan chain and the second scan chain.

21. The non-transitory computer readable medium of claim 18, wherein the determining of the first scan chain comprises selecting from among the flip flops in the first group and connecting the selected flip flops based on a set of criteria.

22. The non-transitory computer readable medium of claim 21, wherein the set of criteria comprises physical proximity, clock domain crossing minimization, power domain crossing minimization, and library domain crossing minimization.

* * * * *